(12) United States Patent
Kim et al.

(10) Patent No.: US 10,411,726 B2
(45) Date of Patent: Sep. 10, 2019

(54) QUANTIZER INCLUDING CAPACITORS AND OPERATING METHOD OF QUANTIZER

(71) Applicant: SAMSUNG ELECTRONICS CO., LTD., Suwon-si, Gyeonggi-Do (KR)

(72) Inventors: Yong-Woo Kim, Seongnam-si (KR); Dai Shi, Yongin-si (KR); Eun Seok Shin, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 16/055,193

(22) Filed: Aug. 6, 2018

(65) Prior Publication Data
US 2019/0190534 A1    Jun. 20, 2019

(30) Foreign Application Priority Data
Dec. 14, 2017    (KR) .................. 10-2017-0172574

(51) Int. Cl.
H03M 3/00    (2006.01)
H03M 7/36    (2006.01)

(52) U.S. Cl.
CPC .......... *H03M 3/428* (2013.01); *H03M 3/502* (2013.01); *H03M 7/3026* (2013.01)

(58) Field of Classification Search
CPC ..... H03M 3/428; H03M 3/502; H03M 7/3026
USPC ....................... 341/122, 143, 155
See application file for complete search history.

(56) References Cited

U.S. PATENT DOCUMENTS

| | | | | |
|---|---|---|---|---|
| 5,157,397 A * | 10/1992 | Vernon | ................. | H03M 1/365 341/118 |
| 6,426,714 B1 * | 7/2002 | Ruha | ..................... | H03M 1/066 341/118 |
| 6,473,019 B1 * | 10/2002 | Ruha | ..................... | H03M 3/334 341/143 |
| 6,587,060 B1 | 7/2003 | Abbey | | |
| 6,909,394 B2 | 6/2005 | Doerrer et al. | | |
| 6,940,437 B2 | 9/2005 | Trotter et al. | | |
| 7,190,296 B2 | 3/2007 | Gupta | | |
| 7,230,559 B2 | 6/2007 | Dias | | |

(Continued)

FOREIGN PATENT DOCUMENTS

| | | |
|---|---|---|
| JP | 2010171484 A | 8/2010 |
| JP | 2014090308 A | 5/2014 |

OTHER PUBLICATIONS

Yang et al., "A 0.5-V 35-µW 85-dB DR Double-Sampled ΔΣ Modulator for Audio Applications," IEEE Journal of Solid-State Circuits, vol. 47, No. 3, Mar. 2012, pp. 722-735.

Bolatkale et al., "A 4GHz CT ΔΣ ADC with 70dB DR and —74dBFS THD in 125MHz BW," ISSCC 2011 / Session 27 / Oversampling Converters / 27.1, 2011 IEEE International Solid-State Circuits Conference, pp. 470-472.

(Continued)

*Primary Examiner* — Lam T Mai
(74) *Attorney, Agent, or Firm* — Volentine, Whitt & Francos, PLLC

(57) ABSTRACT

A quantizer includes: a quantizer capacitor having a first end and a second end; an input calculator that receives input voltages, sums the input voltages, and outputs the summed result to the first end of the quantizer capacitor; a scaler that receives reference voltages and a scale code, generates a scale voltage from the reference voltages depending on the scale code, and outputs the scale voltage to the second end of the quantizer capacitor; and a latch that stores an output voltage of the first end of the quantizer capacitor.

20 Claims, 16 Drawing Sheets

(56) References Cited

U.S. PATENT DOCUMENTS

| | | | |
|---|---|---|---|
| 7,432,841 B1 | 10/2008 | Kinyua | |
| 8,547,266 B2 | 10/2013 | Guinea Trigo et al. | |
| 9,577,662 B2 | 2/2017 | Wei et al. | |
| 9,704,474 B2* | 7/2017 | Hemmsen | G01S 7/52047 |
| 9,960,785 B1* | 5/2018 | O'Donoghue | H03M 3/464 |
| 2008/0001807 A1* | 1/2008 | Chiu | H03M 1/0607 |
| | | | 341/200 |
| 2010/0188274 A1* | 7/2010 | Geen | H03M 3/334 |
| | | | 341/131 |
| 2010/0271525 A1* | 10/2010 | Takahashi | H03M 1/14 |
| | | | 348/308 |
| 2016/0249004 A1* | 8/2016 | Saeki | H03K 23/005 |
| 2017/0111056 A1 | 4/2017 | Tkachev | |

OTHER PUBLICATIONS

Lee et al., "A 66dB SNDR 15MHz BW SAR Assisted ΔΣ ADC in 22nm Tri-gate CMOS," 2013 Symposium on VLSI Circuits Digest of Technical Papers, C64-C65.

Liu et al., "A 95dB SNDR Audio ΔΣ Modulator in 65nm CMOS," Tsinghua University, Bejing, China.

Hsu et al., "A First-Order Low Distortion Sigma-Delta Modulator Using Split DWA Technique and SAR Quantizer," Department of EE, National Cheng Kung University, Tainan, Taiwan.

Xu et al., "Ultra Low-FOM High-Precision ΔΣ Modulators with Fully-Clocked SO and Zero Static Power Quantizers," Institute of VLSI Design, Zhejiang University, China, Analog Devices, Shanghai, China.

* cited by examiner

QUANTIZER INCLUDING CAPACITORS AND OPERATING METHOD OF QUANTIZER

CROSS-REFERENCE TO RELATED APPLICATIONS

This application claims priority under 35 U.S.C. § 119 to Korean Patent Application No. 10-2017-0172574 filed on Dec. 14, 2017, in the Korean Intellectual Property Office, the disclosure of which is incorporated by reference herein in its entirety.

BACKGROUND

Embodiments of the inventive concept relate to an electronic device, and in particular, to a quantizer including capacitors, and an operating method of the quantizer.

A quantizer converts an analog input signal into a digital output signal. The quantizer is used in various fields. For example, the quantizer may be used in a delta-sigma modulator. In particular, in a 2nd order and higher order delta-sigma modulator, a quantizer may be configured to convert two or more analog input signals into one digital output signal.

A typical quantizer uses an active element such an amplifier. In this case, the typical quantizer occupies a large area, has high complexity, and consumes a static current. Accordingly, there is an increasing demand on a quantizer having a reduced area, reduced complexity, and a reduced static current.

SUMMARY

Embodiments of the inventive concept provide a quantizer which may have a reduced area, reduced complexity, and a reduced static current, and further provide an operating method of the quantizer.

According to an exemplary embodiment, a quantizer includes a quantizer capacitor having a first end and a second end, an input calculator that receives input voltages, sums the input voltages, and outputs the summed result to the first end of the quantizer capacitor, a scaler that receives reference voltages and a scale code, generates a scale voltage from the reference voltages depending on the scale code, and outputs the scale voltage to the second end of the quantizer capacitor, and a latch that stores an output voltage of the first end of the quantizer capacitor.

According to another exemplary embodiment, a quantizer includes a quantizer capacitor having a first end and a second end, an input calculator that includes addition capacitors, receives input voltages, combines the input voltages by using the addition capacitors, and transfers the combined result to the first end of the quantizer capacitor, a scaler that includes scale capacitors, receives reference voltages, generates a scale voltage by combining the reference voltages by using the scale capacitors, and transfers the scale voltage to the second end of the quantizer capacitor, and a latch that stores a logical level of an output voltage of the first end of the quantizer capacitor.

According to yet another exemplary embodiment, an operation method of a quantizer which includes a quantizer capacitor, scale capacitors, and addition capacitors includes initializing a scale code, equalizing voltages of the scale capacitors and the addition capacitors, combining input voltages by using the addition capacitors to apply the combined result of the input voltages to a first end of the quantizer capacitor and combining reference voltages by using the scale capacitors depending on the scale code to apply the combined result of the reference voltages to a second end of the quantizer capacitor, and latching a voltage of the first end of the quantizer capacitor.

According to still another embodiment, a device comprises: an input calculator configured to receive a plurality of input voltages, to sum the input voltages, and to output a sum of the input voltages as a combination voltage; a scaler configured to receive reference voltages and a scale code, to generate a scale voltage from the reference voltages and the scale code, and to output the scale voltage; a quantizer capacitor having a first end connected to receive the combination voltage and having a second end connected to receive the scale voltage, wherein the quantizer capacitor is configured to output an output voltage in response to the combination voltage and the scale voltage; a first latch configured to receive the output voltage and, in response to a clock, to generate complementary first and second intermediate output signals corresponding to a logic level of the output voltage; and a set and reset latch configured to receive the first and second intermediate output signals and in response thereto to output and latch a digital output.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Below, embodiments of the inventive concept may be described in detail and clearly to such an extent that an ordinary one in the art easily implements the inventive concept.

Figure 1:
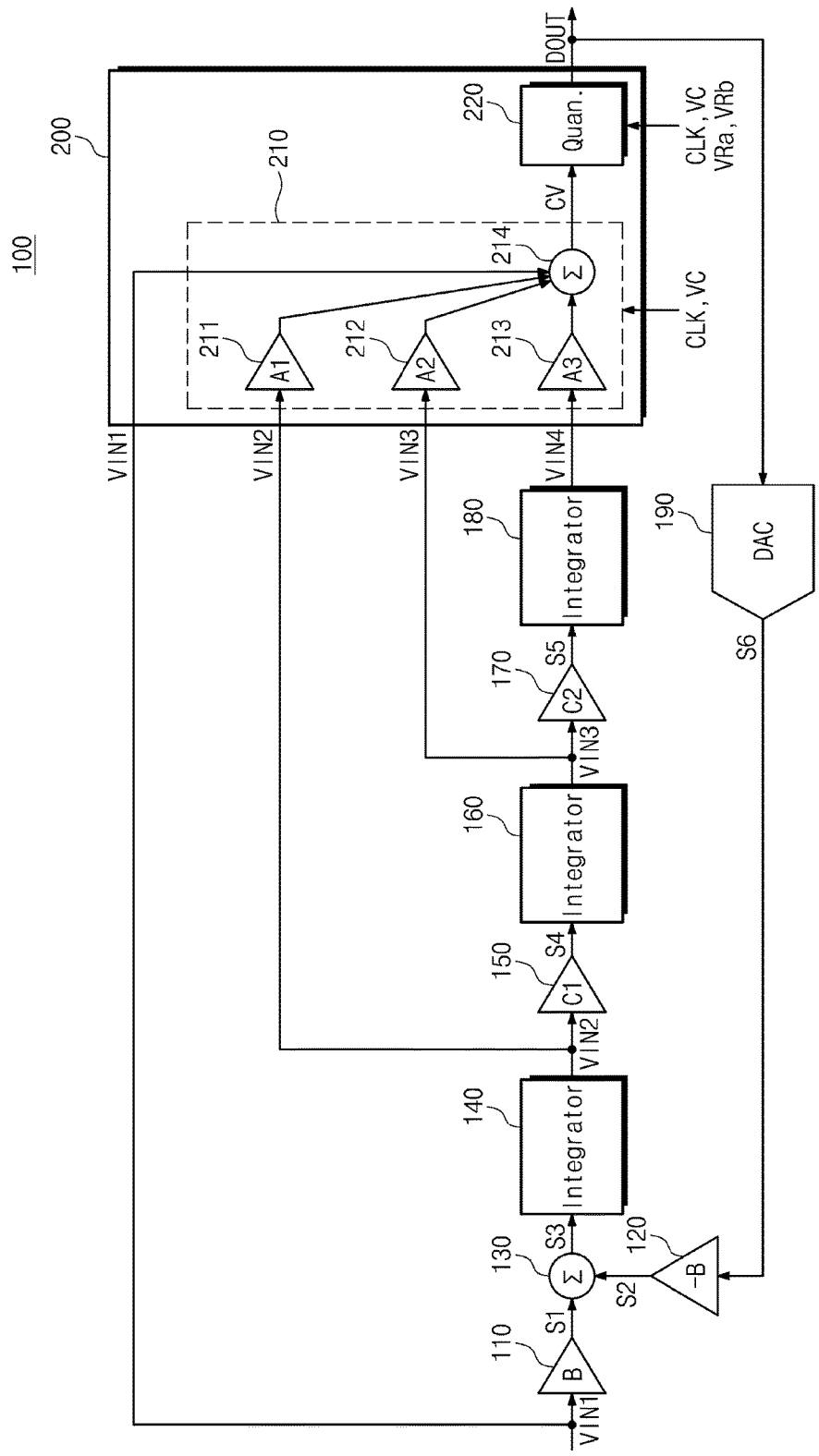
FIG. 1 is a block diagram illustrating an embodiment of a delta-sigma modulator.

FIG. 1 is a block diagram illustrating an embodiment of a delta-sigma modulator 100. Delta-sigma modulator 100 may convert a first input voltage VIN1 being an analog signal into a digital output DOUT. In an embodiment, an example of a third order delta-sigma modulator is illustrated in FIG. 1, but other embodiments of delta-sigma modulator 100 are not limited to third order.

Referring to FIG. 1, delta-sigma modulator 100 includes a first input gain adjustment unit 110, a feedback gain adjustment unit 120, a feedback adder 130, a first integrator 140, a second input gain adjustment unit 150, a second integrator 160, a third input gain adjustment unit 170, a third integrator 180, a quantizer 200, and a digital-to-analog converter (DAC) 190.

First input gain adjustment unit 110 may apply a first input gain "B" to the first input voltage VIN1 to output a first signal S1. Feedback gain adjustment unit 120 may apply a feedback gain "−B" to a sixth signal S6 output from digital-to-analog converter 190 to output a second signal S2. For example, the first input gain "B" and the feedback gain "−B" may have the same value and may have different signs.

Feedback adder 130 may add the first signal S1 and the second signal S2 to output a third signal S3 which may also be referred to as a feedback added input signal. Feedback adder 130 is named on the basis of the fact that the first signal S1 and the second signal S2 corresponding to a feedback version of the digital output DOUT are added, and the term does not limit the technical idea.

First integrator 140 may integrate the third signal S3 to output a second input voltage VIN2. Second input gain adjustment unit 150 may apply a second input gain C1 to the second input voltage VIN2 to output a fourth signal S4. Second integrator 160 may integrate the fourth signal S4 to output a third input voltage VIN3. Third input gain adjustment unit 170 may apply a third input gain C2 to the third input voltage VIN3 to output a fifth signal S5.

Third integrator 180 may integrate the fifth signal S5 to output a fourth input voltage VIN4. The first to fourth input voltages VIN1 to VIN4 are transferred to quantizer 200. Quantizer 200 may combine the first to fourth input voltages VIN1 to VIN4 to generate the digital output DOUT.

For example, quantizer 200 may add the first to fourth input voltages VIN1 to VIN4 and may quantize the added result to output the digital output DOUT. Quantizer 200 includes an input calculator 210 and an analog-to-digital quantizer 220. Input calculator 210 may receive the first to fourth input voltages VIN1 to VIN4, a clock signal CLK, and a common voltage VC.

Input calculator 210 may combine the first to fourth input voltages VIN1 to VIN4 by using the clock signal CLK and the common voltage VC and may output the combination result as a combination voltage CV. Input calculator 210 includes first, second, and third gain adjustment units 211, 212, and 213 and an adder 214.

First gain adjustment unit 211 may apply a first gain A1 to the second input voltage VIN2. Second gain adjustment unit 212 may apply a second gain A2 to the third input voltage VIN3. Third gain adjustment unit 213 may apply a third gain A3 to the fourth input voltage VIN4. Adder 214 may add the first input voltage VIN1 and outputs of first to third gain adjustment units 211 to 213.

Adder 214 may output the addition result as the combination voltage CV. Analog-to-digital quantizer 220 may receive the combination voltage CV, the clock signal CLK, the common voltage VC, and reference voltages VRa and VRb. Analog-to-digital quantizer 220 may quantize the combination voltage CV to the digital output DOUT by using the clock signal CLK, the common voltage VC, and the reference voltages VRa and VRb.

Digital-to-analog converter 190 may convert the digital output DOUT to the sixth signal S6 being an analog signal. Digital-to-analog converter 190 may output the sixth signal S6 to feedback gain adjustment unit 120.

For example, the clock signal CLK may be received from an external clock generating device. The common voltage VC and the reference voltages VRa and VRb may be received from an external voltage generator. The clock signal CLK, the common voltage VC, or the reference voltages VRa and VRb may be transferred to at least one component from among components of delta-sigma modulator 100 which need the clock signal CLK, the common voltage VC, or the reference voltages VRa and VRb.

For example, quantizer 200 may be named a "delta-sigma quantizer" in that quantizer 200 is used in the delta-sigma modulator, and the technical feature is not limited by the term. In various embodiments, the number of integrators (e.g., 140, 160, and 180) included in delta-sigma modulator 100 may be changed according to the order of delta-sigma modulator 100.

The number of input voltages (e.g., VIN1 to VIN4) transferred to quantizer 200 may vary with the number of integrators (e.g., 140, 160, and 180) included in delta-sigma modulator 100. That is, the number of input voltages (e.g., VIN1 to VIN4) of quantizer 200 may vary with the order of delta-sigma modulator 100 in which quantizer 200 is included.

Components of delta-sigma modulator 100 is above described by using the terms "first", "second", "third", and the like. However, the terms "first", "second", "third", and the like may be used to distinguish components from each other and do not limit the inventive concept. For example, the terms "first", "second", "third", and the like do not involve an order or a numerical meaning of any form.

Figure 2:
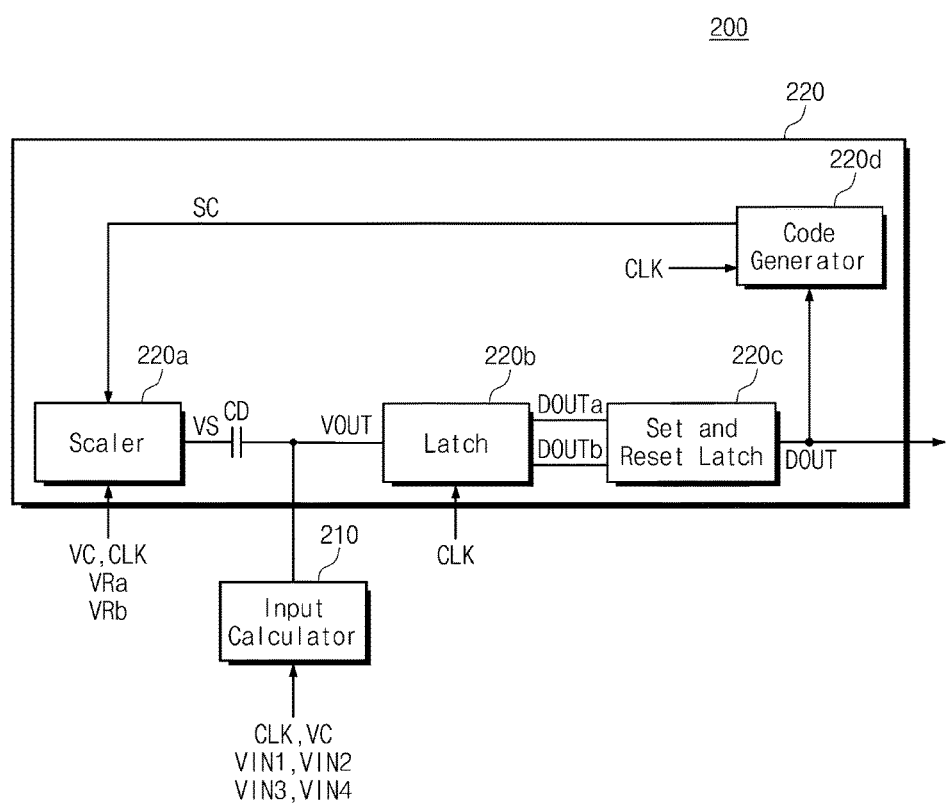
FIG. 2 is a block diagram illustrating an embodiment of a quantizer.

FIG. 2 is a block diagram illustrating an embodiment of quantizer 200. Referring to FIGS. 1 and 2, quantizer 200 includes input calculator 210 and analog-to-digital quantizer 220. In an embodiment, input calculator 210 may be configured to perform functions of first to third gain adjustment units 211 to 213 and adder 214.

Input calculator 210 may receive the clock signal CLK from an external clock generating device. Input calculator 210 may receive the common voltage VC from an external voltage generating device. Input calculator 210 may receive the first to fourth input voltages VIN1 to VIN4.

Input calculator 210 may combine the first to fourth input voltages VIN1 to VIN4 by using (or based on) the clock signal CLK and the common voltage VC. Input calculator 210 may transfer the combination voltage CV (refer to FIG. 1 and FIG. 7, described below), in which the first to fourth input voltages VIN1 to VIN4 are combined, to a first end of a quantizer capacitor CD of analog-to-digital quantizer 220.

Analog-to-digital quantizer 220 may quantize a voltage transferred from input calculator 210 to the digital output DOUT. Analog-to-digital quantizer 220 includes the quantizer capacitor CD, a scaler 220a, a latch 220b, a set and reset latch 220c, and a code generator 220d.

Scaler 220a may receive the clock signal CLK from an external clock generating device. Scaler 220a may receive the common voltage VC and the reference voltages VRa and VRb from an external voltage generating device. Scaler 220a may receive a scale code SC from code generator 220d.

Scaler 220a may generate a scale voltage VS by using (or based on) the clock signal CLK, the common voltage VC, and the reference voltages VRa and VRb. For example, a level of the scale voltage VS may be adjusted by the scale code SC. Scaler 220a may transfer the scale voltage VS to a second end of the quantizer capacitor CD.

Figure 3:
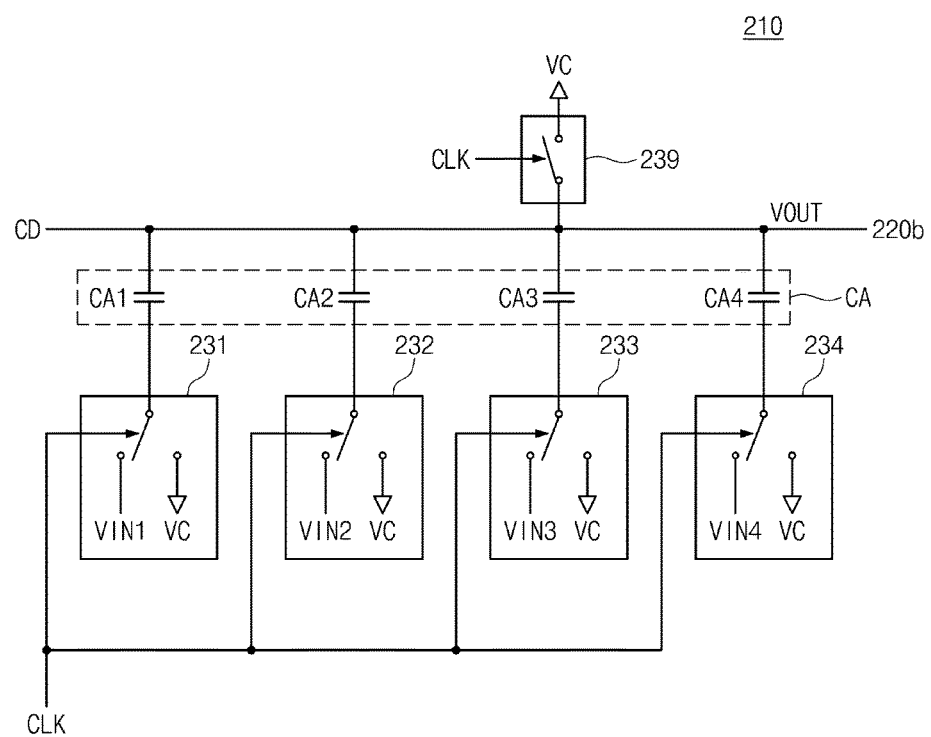
FIG. 3 illustrates an embodiment of an input calculator.

Input calculator 210 applies the combination voltage CV to the first end of the quantizer capacitor CD through one or more capacitors (refer to FIG. 3). Since the scale voltage VS is transferred to the second end of the quantizer capacitor CD, a voltage of the first end of the quantizer capacitor CD may appear as a combination of the combination voltage CV that input calculator 210 supplies and the scale voltage VS that scaler 220a supplies. In an embodiment, the combination of the combination voltage CV and the scale voltage VS may correspond to an output voltage VOUT.

Latch 220b may receive the clock signal CLK from the external clock generating device. Latch 220b may receive the voltage of the first end of the quantizer capacitor CD as the output voltage VOUT. Latch 220b may latch (or store) a logical level of the output voltage VOUT in synchronization with the clock signal CLK.

Latch 220b may output the logical level of the output voltage VOUT as a first intermediate digital output DOUTa. Latch 220b may output an inverted level of the logical level of the output voltage VOUT as a second intermediate digital output DOUTb. That is, DOUTa and DOUTb may be complementary first and second intermediate digital output signals. The first and second intermediate digital outputs DOUTa and DOUTb may be transferred to set and reset latch 220c.

Set and reset latch 220c may store the first and second intermediate digital outputs DOUTa and DOUTb. Set and reset latch 220c may output the first intermediate digital output DOUTa having the logical level of the output voltage VOUT as the digital output DOUT. The digital output DOUT is transferred to digital-to-analog converter 190 and code generator 220d.

Code generator 220d may receive the clock signal CLK from the external clock generating device. Code generator 220d may receive the digital output DOUT from set and reset latch 220c. Code generator 220d may adjust the scale code SC depending on the digital output DOUT or depending on a history of the digital output DOUT. For example, code generator 220d may adjust the scale code SC in synchronization with the clock signal CLK.

To sum up, input calculator 210 may combine the first to fourth input voltages VIN1 to VIN4 and may transfer the combination result to the first end of the quantizer capacitor CD. Scaler 220a may generate the scale voltage VS depending on the scale code SC and may transfer the scale voltage VS to the second end of the quantizer capacitor CD. The output voltage VOUT may depend on a difference between the combination voltage CV, which input calculator 210 transfers, and the scale voltage VS.

Latch 220b may store the logical level of the output voltage VOUT. That is, latch 220b may store whether the combination voltage CV of input calculator 210 is greater or smaller than the scale voltage VS, in form of a logical level. For example, if the combination voltage CV of input calculator 210 is equal to or greater than (not smaller than) the scale voltage VS, the output voltage VOUT may have a logical high level, and latch 220b may store the logical high level.

If the combination voltage CV of input calculator 210 is smaller than (not equal to or greater than) the scale voltage VS, the output voltage VOUT may have a logical low level, and latch 220b may store the logical low level. Set and reset latch 220c may statically store the first and second intermediate digital outputs DOUTa and DOUTb output from latch 220b.

Set and reset latch 220c may output the first intermediate digital output DOUTa as the digital output DOUT. The digital output DOUT may be a quantized value. For example, set and reset latch 220c may successively output a plurality of digital bits quantized from the input voltages VIN1 to VIN4 of the combination voltage CV. Set and reset latch 220c may output respective digital bit as the digital output DOUT at a time. The number of the plurality of digital bits may be a resolution of the analog-to-digital quantizer 220. The analog-to-digital quantizer 220 may be a successive approximation quantizer.

Code generator 220d may adjust the scale voltage VS through the scale code SC such that the digital output DOUT is generated based on binary search. For example, code generator 220d may adjust the scale code SC such that a search window of the binary search, that is, a level of the scale voltage VS, is adjusted according to the digital output DOUT (or current or previous digital outputs).

As described above, quantizer 200 may sequentially convert the combination voltage CV, in which the first to fourth input voltages VIN1 to VIN4 are combined, to the digital output DOUT based on successive approximation. A successive set of the digital outputs DOUT may form digital bits for which the first input voltage VIN1 is modulated by delta-sigma modulator 100.

FIG. 3 illustrates an embodiment of input calculator 210. Referring to FIGS. 2 and 3, input calculator 210 includes first to fourth addition capacitors CA1 to CA4, first to fourth addition switches 231 to 234, and a first switch 239. The first to fourth addition capacitors CA1 to CA4 may be connected to the first end of the quantizer capacitor CD. A sum of capacitances of the first to fourth addition capacitors CA1 to CA4 may appear as an addition capacitance CA.

First to fourth addition switches 231 to 234 may be respectively connected to the first to fourth addition capacitors CA1 to CA4. First to fourth addition switches 231 to 234 may respectively transfer the first to fourth input voltages VIN1 to VIN4 or the common voltage VC to the first to fourth addition capacitors CA1 to CA4 in response to the clock signal CLK.

First switch 239 is connected to the first end of the quantizer capacitor CD. In response to the clock signal CLK, first switch 239 may transfer the common voltage VC to the first end of the quantizer capacitor CD or may stop a transfer of the common voltage VC. A voltage of the first end of the quantizer capacitor CD may be transferred to latch 220b as the output voltage VOUT.

In an embodiment, the first to fourth addition capacitors CA1 to CA4 may be associated with the gains A1 to A3 of first to third gain adjustment units 211 to 213. For example, the first addition capacitor CA1 associated with the first input voltage VIN1 may have a capacitance corresponding to a unit gain (e.g., "1") as the first input voltage VIN1 is transferred to adder 214 without a gain in FIG. 1.

The second addition capacitor CA2 associated with the second input voltage VIN2 may have a capacitance corresponding to the gain A1 of first gain adjustment unit 211 associated with the second input voltage VIN2 in FIG. 1. The third addition capacitor CA3 associated with the third input voltage VIN3 may have a capacitance corresponding to the gain A2 of second gain adjustment unit 212 associated with the third input voltage VIN3 in FIG. 1.

The fourth addition capacitor CA4 associated with the fourth input voltage VIN4 may have a capacitance corresponding to the gain A3 of third gain adjustment unit 213 associated with the fourth input voltage VIN4 in FIG. 1. For example, ratios of capacitances of the first to fourth addition capacitors CA1 to CA4 may be determined according to a ratio of the unit gain (e.g., "1") and the gains A1 to A3 of first to third gain adjustment units 211 to 213.

In an embodiment, the numbers of addition capacitors (e.g., CA1 to CA4) and addition switches (e.g., 231 to 234) of input calculator 210 may be determined according to the number of input voltages to be transferred to quantizer 200. The first to fourth addition capacitors CA1 to CA4 and first to fourth addition switches 231 to 234 corresponding to the first to fourth input voltages VIN1 to VIN4 are illustrated in FIG. 3, but the embodiments are not limited thereto.

Figure 4:
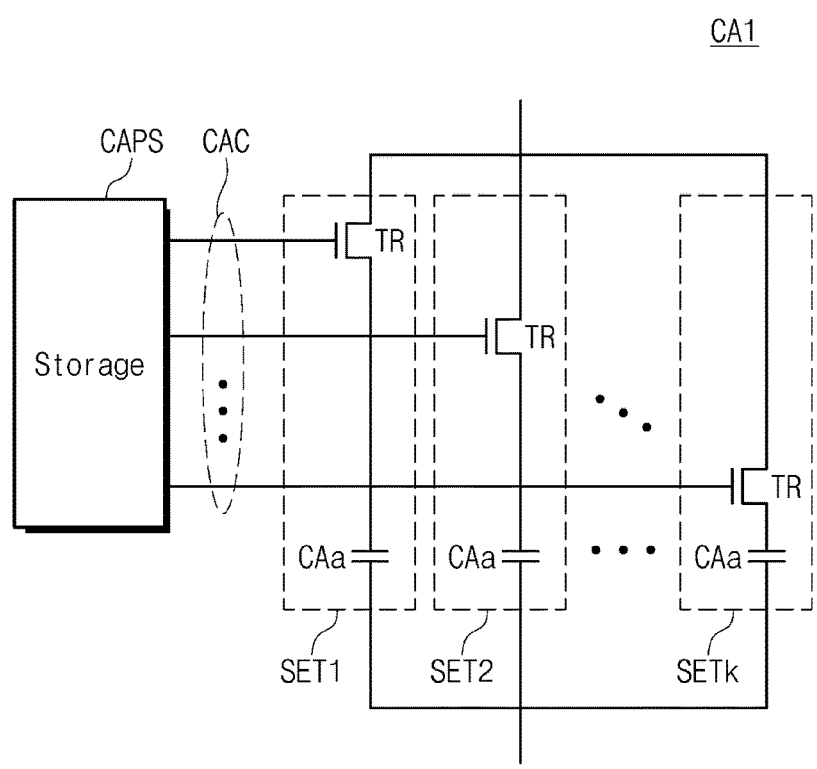
FIG. 4 illustrates an implementation example of one of addition capacitors of FIG. 3.

FIG. 4 illustrates an implementation example of one (e.g., CA1) of the addition capacitors CA1 to CA4 of FIG. 3. Referring to FIGS. 3 and 4, the addition capacitor CA1 may include capacitor sets SET1 to SETk (k being a positive integer more than "1") connected in parallel. Each of the capacitor sets SET1 to SETk may include a transistor TR and a sub capacitor CAa connected in series.

In the capacitor sets SET1 to SETk, the transistors TR may be gated according to a capacitor code CAC transferred from capacitor storage CAPS. For example, the capacitor storage CAPS may include one of various recording media such as a nonvolatile memory cell, an electrical fuse, an anti-fuse, and a metal option. The capacitor storage CAPS may be disposed inside or outside quantizer 200 or delta-sigma modulator 100.

If one of the capacitor sets SET1 to SETk is activated by the capacitor code CAC, the transistor TR of the activated capacitor set may be turned on. If the transistor TR is turned on, the sub capacitor CAa of the activated capacitor set may be applied to the addition capacitor CA1.

If one of the capacitor sets SET1 to SETk is deactivated by the capacitor code CAC, the transistor TR of the deactivated capacitor set may be turned off. If the transistor TR is turned off, the sub capacitor CAa of the deactivated capacitor set may not be applied to the addition capacitor CA1. The capacitances of the first to fourth addition capacitors CA1 to CA4 may be adjusted to correspond to the unit gain and the gains A1 to A3 in the above-described manner.

In an embodiment, the sub capacitors CAa may have the same structure, the same size, and the same capacitance. If the sub capacitors CAa have the same structure, the same size, and the same capacitance, influence of a noise such as an environment noise may be identically applied to the sub capacitors CAa.

If the influence of the noise is identically applied to the sub capacitors CAa, the influence of the noise on an operation of input calculator 210 may decrease (or minimized). Accordingly, input calculator 210 is robust to noise, and the reliability of input calculator 210 is improved.

Figure 5:
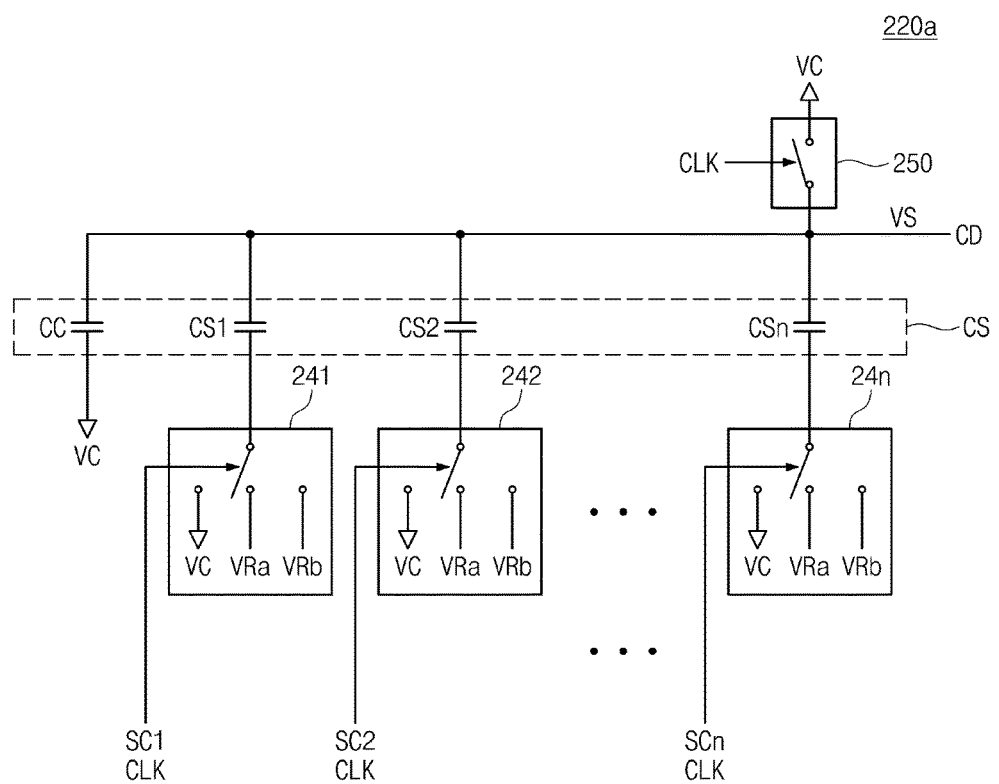
FIG. 5 illustrates an embodiment of a scaler.

FIG. 5 illustrates an embodiment of scaler 220a. Referring to FIGS. 2 and 5, scaler 220a includes first to n-th scale capacitors CS1 to CSn (n being a positive integer), a common capacitor CC, first to n-th scale switches 241 to 24n, and a second switch 250.

The first to n-th scale capacitors CS1 to CSn may be connected to the second end of the quantizer capacitor CD. First to n-th scale switches 241 to 24n are respectively connected to the first to n-th scale capacitors CS1 to CSn. In response to first to n-th codes SC1 to SCn and/or the clock signal CLK, each of first to n-th scale switches 241 to 24n may transfer one of the common voltage VC and the reference voltages VRa and VRb to the corresponding scale capacitor of the first to n-th scale capacitors CS1 to CSn.

The common capacitor CC may be connected between the second end of the quantizer capacitor CD and a node to which the common voltage VC is supplied. A sum of capacitances of the first to n-th scale capacitors CS1 to CSn and the common capacitor CC may appear as a scale capacitance CS.

The first to n-th codes SC1 to SCn may form the scale code SC output from code generator 220d. In response to the clock signal CLK, second switch 250 may transfer the common voltage VC to the second end of the quantizer capacitor CD, or may stop a transfer of the common voltage VC.

In an embodiment, the numbers of scale capacitors (e.g., CS1 to CSn) and scale switches (e.g., 241 to 24n) may be determined according to the number of digital bits that quantizer 200 intends to finally obtain by successively outputting the digital output DOUT. For example, when a quantizer is an n-bit successive approximation quantizer, the number of scale capacitors (e.g., CS1 to CSn) and the number of scale switches (e.g., 241 to 24n) may be $2^n$.

In an embodiment, the scale capacitors CS1 to CSn and the common capacitor CC may have the same structure, the same size, and the same capacitance. If the scale capacitors CS1 to CSn and the common capacitor CC have the same structure, the same size, and the same capacitance, influence of noise such as an environment noise may be identically applied to the scale capacitors CS1 to CSn and the common capacitor CC.

If the influence of the noise is identically applied to the scale capacitors CS1 to CSn and the common capacitor CC, the influence of the noise on an operation of scaler 220a may decrease (or may be minimized). Accordingly, scaler 220a is robust to a noise, and the reliability of scaler 220a is improved.

In an embodiment, the scale capacitors CS1 to CSn and the common capacitor CC may have the same structure, the same size, and the same capacitance as the sub capacitors CAa (refer to FIG. 4) of input calculator 210 (refer to FIG. 3). If the scale capacitors CS1 to CSn and the common capacitor CC may have the same structure, the same size, and the same capacitance as the sub capacitors CAa (refer to FIG. 4), influence of a noise such as an environment noise may be identically applied to the scale capacitors CS1 to CSn, common capacitor CC, and the sub capacitors CAa.

If the influence of noise is identically applied to the scale capacitors CS1 to CSn, common capacitor CC, and the sub capacitors CAa, the influence of noise on operations of input calculator 210 and scaler 220a may decrease (or may be minimized). Accordingly, input calculator 210 and scaler 220a may be robust to a noise, and the reliability of input calculator 210 and scaler 220a may be improved.

If input calculator 210 and scaler 220a are implemented with the same single element (e.g., a capacitor), an operating characteristic of input calculator 210 may be similar to an operating characteristic of scaler 220a. Accordingly, an error due to a difference between the operating characteristics of input calculator 210 and scaler 220a may decrease (or may be minimized).

Figure 6:
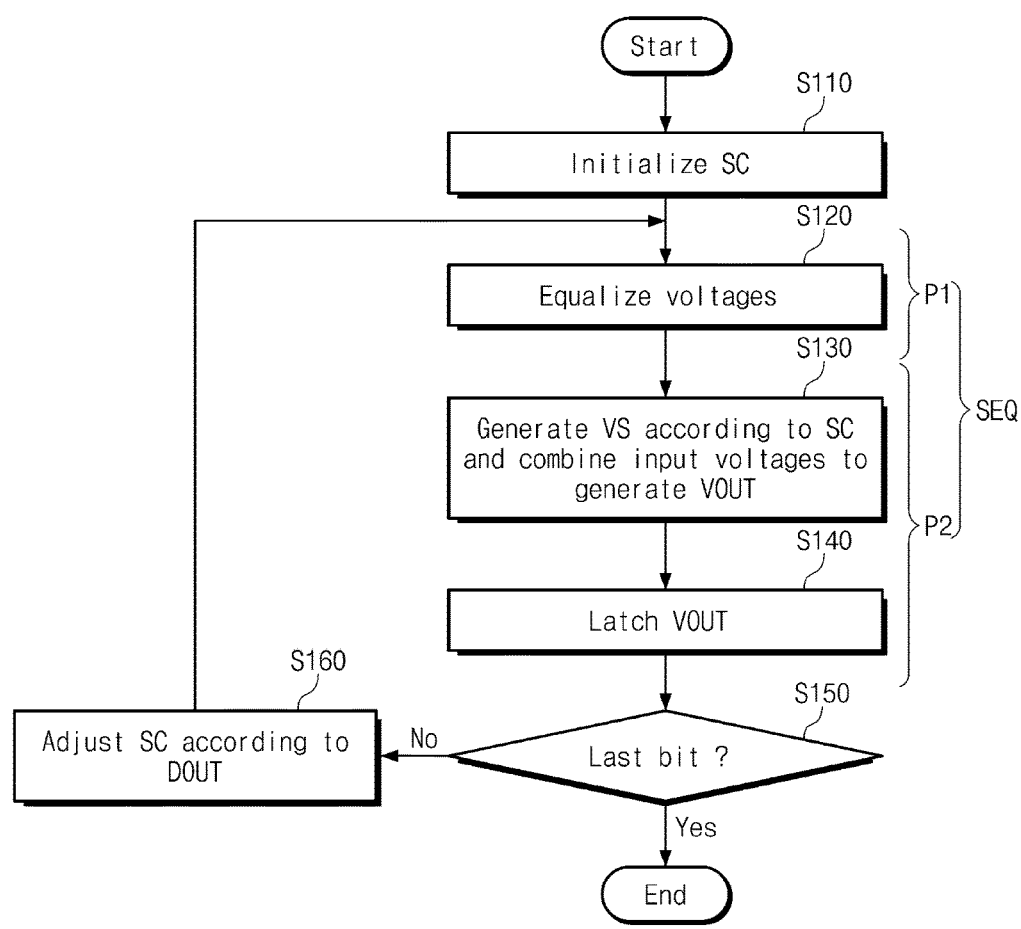
FIG. 6 is a flowchart illustrating an embodiment of an operating method of a quantizer according to an embodiment of the inventive concept.

FIG. 6 is a flowchart illustrating an embodiment of an operating method. In an embodiment, an example in which quantizer 200 successively outputs the digital output DOUT to generate one set of digital bits is illustrated in FIG. 6.

Referring to FIGS. 2 and 6, in operation S110, code generator 220d of quantizer 200 may initialize the scale code SC. For example, quantizer 200 may initialize the scale code SC such that the scale voltage VS has an initial value of the binary search. Quantizer 200 may initialize the scale code SC such that the scale voltage VS has an intermediate level of the reference voltages VRa and VRb.

In operation S120, quantizer 200 performs a first phase P1 of one sequence SEQ.

For example, the one sequence SEQ may be a procedure of generating one digital output DOUT. The one sequence SEQ may include the first phase P1 and a second phase P2. The first and second phases P1 and P2 may be divided by an edge of the clock signal CLK. In the first phase P1 of the sequence SEQ, that is, in operation S120, quantizer 200 may equalize voltages.

For example, input calculator 210 and scaler 220a may equalize internal voltages or external voltages (e.g., the output voltage VOUT or the scale voltage VS) to the common voltage VC. The first phase P1 may correspond to a step of initializing input calculator 210 and scaler 220a for the purpose of generating the digital output DOUT.

During the first phase P1, input calculator 210 may perform equalization in response to the clock signal CLK. Scaler 220a may perform equalization in response to the clock signal CLK and the scale code SC. Latch 220b may be in an inactive state. Set and reset latch 220c may statically maintain logical levels stored therein. Code generator 220d may control the scale code SC such that scaler 220a performs equalization.

Operation S130 and operation S140 correspond to the second phase P2 of the one sequence SEQ. In operation S130, scaler 220a may generate the voltage VS depending on the clock signal CLK and/or the scale code SC. Input calculator 210 may combine the first to fourth input voltages VIN1 to VIN4 in response to the clock signal CLK.

The combination result of the input voltages VIN1 to VIN4 may be transferred to the first end of the quantizer capacitor CD. The scale voltage VS may be transferred to the second end of the quantizer capacitor CD. The output voltage VOUT may be generated at the first end of the quantizer capacitor CD by the input voltages VIN1 to VIN4 and the scale voltage VS. For example, the scale voltage VS may boost or drop the voltage of the first end as the output voltage VOUT. As described above referring to FIG. 3, input calculator 210 transfers the input voltages VIN1 to VIN4 through the first to fourth addition capacitors CA1 to CA4. That is, the first end of the quantizer capacitor CD is a floating node. As described above referring to FIG. 5, scaler 220a transfers the scale voltage SC through the first to n-th scale capacitors CS1 to CSn. That is, the second end of the quantizer capacitor CD is also a floating node. The output voltage VOUT may be determined according to the voltages of the first and second ends relatively. If the scale voltage SC is higher than the voltage of the first end, the output voltage VOUT may become a negative voltage. If the scale voltage SC is lower than the voltage of the first end, the output voltage VOUT may become a positive voltage. The output voltage VOUT may represent relative levels of the voltages of the first and second ends. The output voltage VOUT may be used for comparison of successive binary search. Details of the binary search are described below referring to FIG. 7.

In operation S140, latch 220b may latch (or store) a logical level of the output voltage VOUT in response to the clock signal CLK. Set and reset latch 220c may receive and latch (or store) the first and second intermediate digital outputs DOUTa and DOUTb from latch 220b. Set and reset latch 220c may output the first intermediate digital output DOUTa as the digital output DOUT.

If it is determined in operation S150 that the generated digital output DOUT is the last bit of digital bits, quantization of the digital bits is completed. If it is determined in operation S150 that the generated digital output DOUT is not the last bit of digital bits, operation S160 is performed. In operation S160, code generator 220d may adjust the scale code SC depending on the digital output DOUT. Afterwards, the first and second phases P1 and P2 of a next sequence SEQ may be performed.

Figure 7:
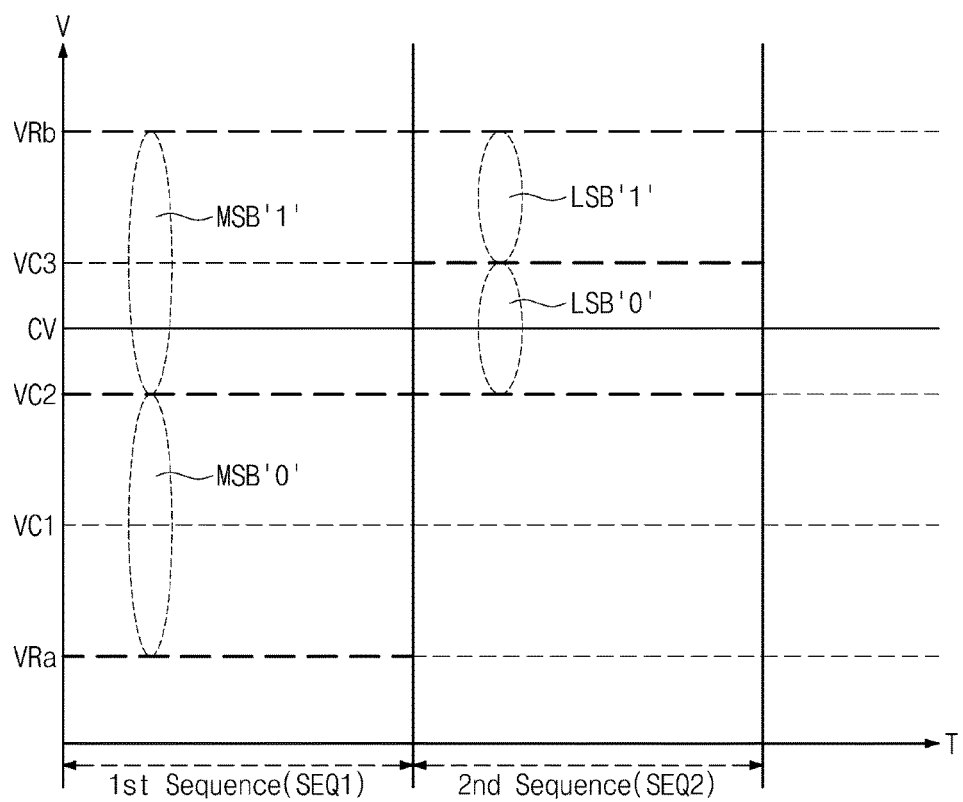
FIG. 7 illustrates an example in which a quantizer iteratively outputs a digital output based on successive approximation.

FIG. 7 illustrates an example in which quantizer 200 iteratively outputs the digital output DOUT based on successive approximation. In FIG. 7, a horizontal axis represents time "T," and a vertical axis represents a voltage "V." In an embodiment, an example in which quantizer 200 outputs the digital output DOUT twice is illustrated in FIG. 7.

Referring to FIGS. 2 and 7, the code generator 220d may initialize the scale code SC before a first sequence SEQ1 or at the beginning of the first sequence SEQ1. For example, quantizer 200 may initialize the scale code SC such that the scale voltage VS has an intermediate level of the reference voltages VRa and VRb.

In an embodiment, the reference voltage VRa may correspond to a lower limit of a level of the output voltage VOUT that quantizer 200 is able to recognize and may be referred to as a "lower reference voltage." The reference voltage VRb may correspond to an upper limit of the level of the output voltage VOUT that quantizer 200 is able to recognize and may be referred to as an "upper reference voltage."

Code generator 220d may control the scale code SC such that the scale voltage VS becomes the second comparison voltage VC2 being an intermediate level of the lower and upper reference voltages VRa and VRb. Input calculator 210 may combine the first to fourth input voltages VIN1 to VIN4 to output the combination voltage CV.

The result of combining the combination voltage CV and the scale voltage VS may appear as the output voltage VOUT. If the combination voltage CV is less than (or not greater than or equal to) the second comparison voltage VC2 being the scale voltage VS, latch 220b and set and reset latch 220c may store the digital output DOUT having "0" being logical low. That is, "0" being logical low may be output as the most significant bit MSB of digital bits of digital output DOUT.

If the combination voltage CV is greater than or equal to (or not less than) the second comparison voltage VC2 being the scale voltage VS, then latch 220b and set and reset latch 220c may store the digital output DOUT having "1" being logical high. That is, "1" being logical high may be output as the most significant bit MSB of digital bits of digital output DOUT.

In an embodiment, the first sequence SEQ1, the combination voltage CV is higher than the second comparison voltage VC2. Accordingly, "1" being logical high may be output as the digital output DOUT in the first sequence SEQ1.

Code generator 220d may initialize the scale code SC before a second sequence SEQ2 starts, or at the beginning of the second sequence SEQ2. For example, if the digital output DOUT is "0" being logical low, code generator 220d may control the scale code SC such that the scale voltage VS has an intermediate level between a lower reference voltage (e.g., VRa) of a previous sequence (e.g., SEQ1) and a comparison voltage (e.g., VC2) of the previous sequence (e.g., SEQ1).

For another example, if the digital output DOUT is "1" being logical high, code generator 220d may control the scale code SC such that the scale voltage VS has an intermediate level (e.g., a third comparison voltage VC3)

between an upper reference voltage (e.g., VRb) of a previous sequence (e.g., SEQ1) and a comparison voltage (e.g., VC2) of the previous sequence (e.g., SEQ1).

Since the digital output DOUT of the first sequence SEQ1 is "1" being logical high, code generator 220d may control the scale code SC such that the scale voltage VS has an intermediate level (e.g., VC3) between the upper reference voltage VRb of the first sequence SEQ1 and the second comparison voltage VC2 of the first sequence SEQ1.

If the combination voltage CV is less than (or not greater than or equal to) a third comparison voltage VC3 being the scale voltage VS, latch 220b and set and reset latch 220c may store the digital output DOUT having "0" being logical low. That is, "0" being logical low may be output as the least significant bit LSB of digital bits.

If the combination voltage CV is greater than or equal to (or not less than) the third comparison voltage VC3 being the scale voltage VS, latch 220b and set and reset latch 220c may store the digital output DOUT having "1" being logical high. That is, "1" being logical high may be output as the least significant bit LSB of digital bits of digital output DOUT.

If the combination voltage CV is less than the third comparison voltage VC3, the digital output DOUT may be "0" being logical low. As described above, the respective digital bits may be sequentially (or successively) output as the digital output DOUT. Accordingly, successive approximation quantization may be performed.

Figure 8:
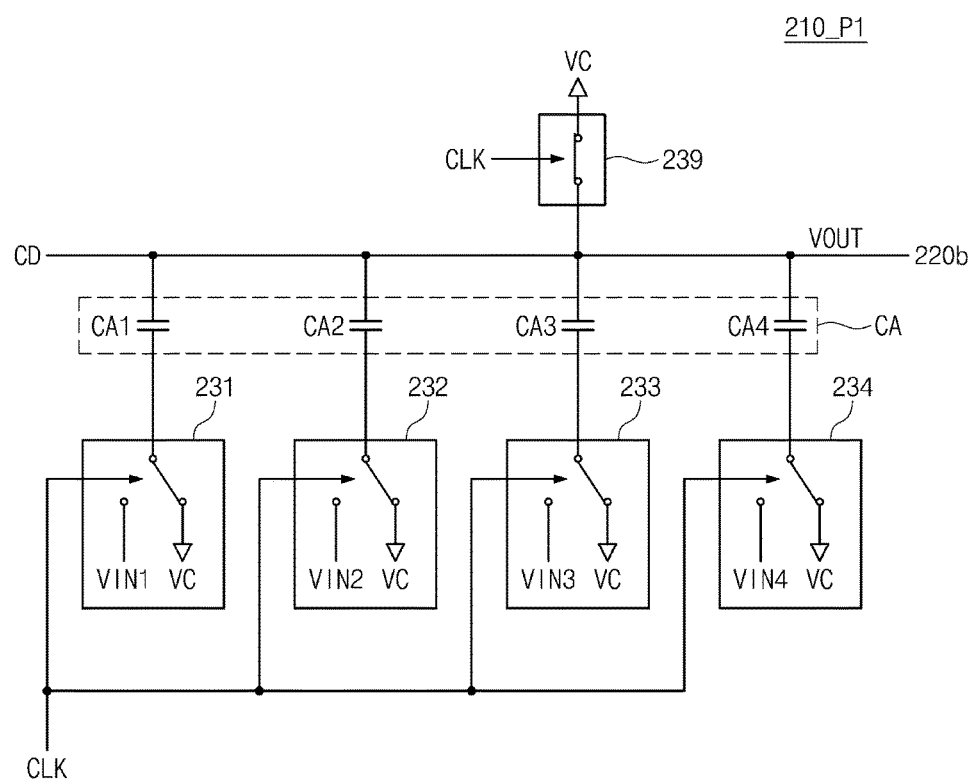
FIG. 8 illustrates an example in which an input calculator operates in a first phase.
Figure 9:
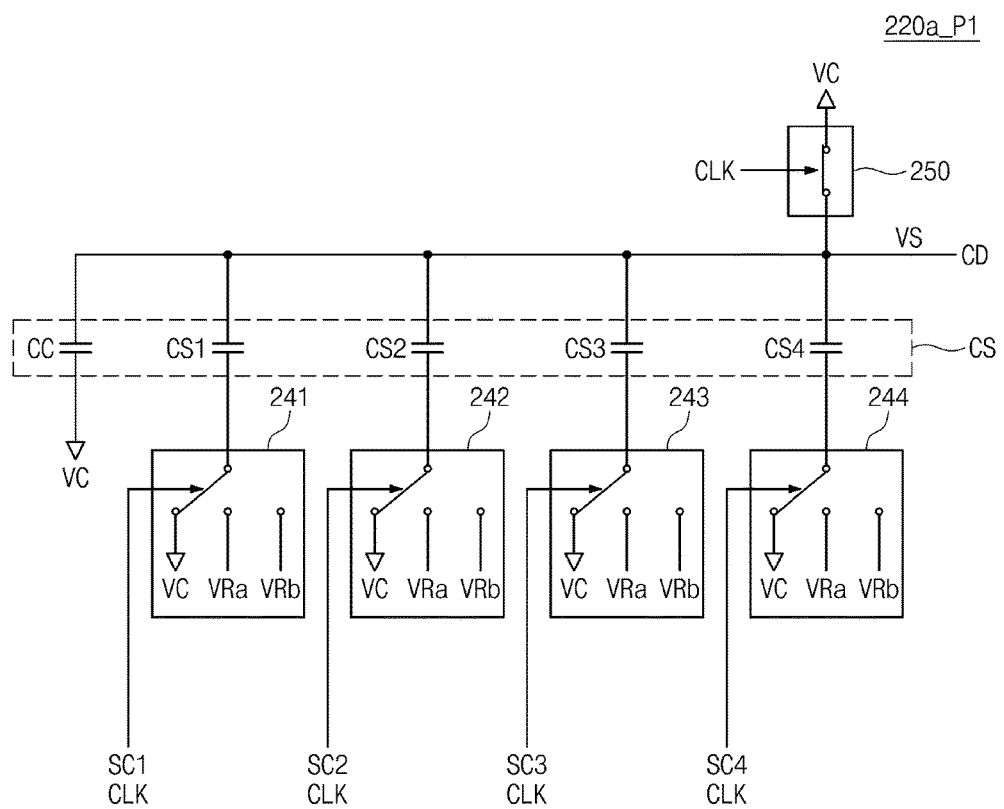
FIG. 9 illustrates an example in which a scaler operates in a first phase.

FIG. 8 illustrates an example in which an input calculator 210_P1 operates in the first phase P1. FIG. 9 illustrates an example in which a scaler 220a_P1 operates in the first phase P1. In an embodiment, an example of scaler 220a_P1 including four scale capacitors CS1 to CS4 and four scale switches 241 to 244 is illustrated in FIG. 9. Referring to FIGS. 8 and 9, the clock signal CLK may have a first level (e.g., a high level) in the first phase P1.

In response to the clock signal CLK, that is, when the clock signal CLK is at the high level, first to fourth addition switches 231 to 234 may supply the common voltage VC to the first to fourth addition capacitors CA1 to CA4. First switch 239 transfers the common voltage VC to the first end of the quantizer capacitor CD. Accordingly, in the first phase P1, input calculator 210_P1 may equalize internal nodes to the common voltage VC.

In response to the clock signal CLK, that is, when the clock signal CLK is at the high level, first to fourth scale switches 241 to 244 may supply the common voltage VC to the first to fourth scale capacitors CS1 to CS4. For example, when the clock signal CLK is at the high level, first to fourth scale switches 241 to 244 may supply the common voltage VC to the first to fourth scale capacitors CS1 to CS4 regardless of the scale code SC.

For another example, when the clock signal CLK is at the high level, code generator 220d may adjust the scale code SC such that first to fourth scale switches 241 to 244 supply the common voltage VC to the first to fourth scale capacitors CS1 to CS4. Second switch 250 may transfer the common voltage VC to the second end of the quantizer capacitor CD. Accordingly, in the first phase P1, input calculator 210_P1 may equalize internal nodes to the common voltage VC.

In the first phase P1, input calculator 210_P1 supplies the common voltage VC to the first end of the quantizer capacitor CD. In the first phase P1, scaler 220a_P1 supplies the common voltage VC to the second end of the quantizer capacitor CD. Accordingly, in the first phase P1, input calculator 210_P1 and scaler 220a_P1 may equalize external nodes, for example, opposite ends of the quantizer capacitor CD to the common voltage VC.

Figure 10:
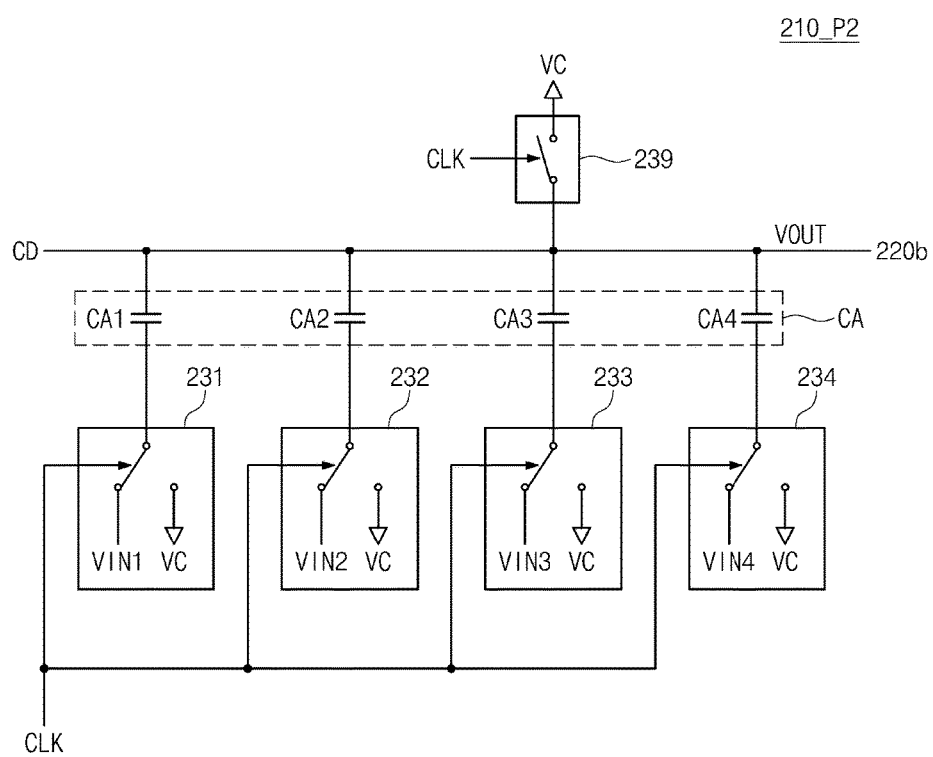
FIG. 10 illustrates an example in which an input calculator operates in a second phase.
Figure 11:
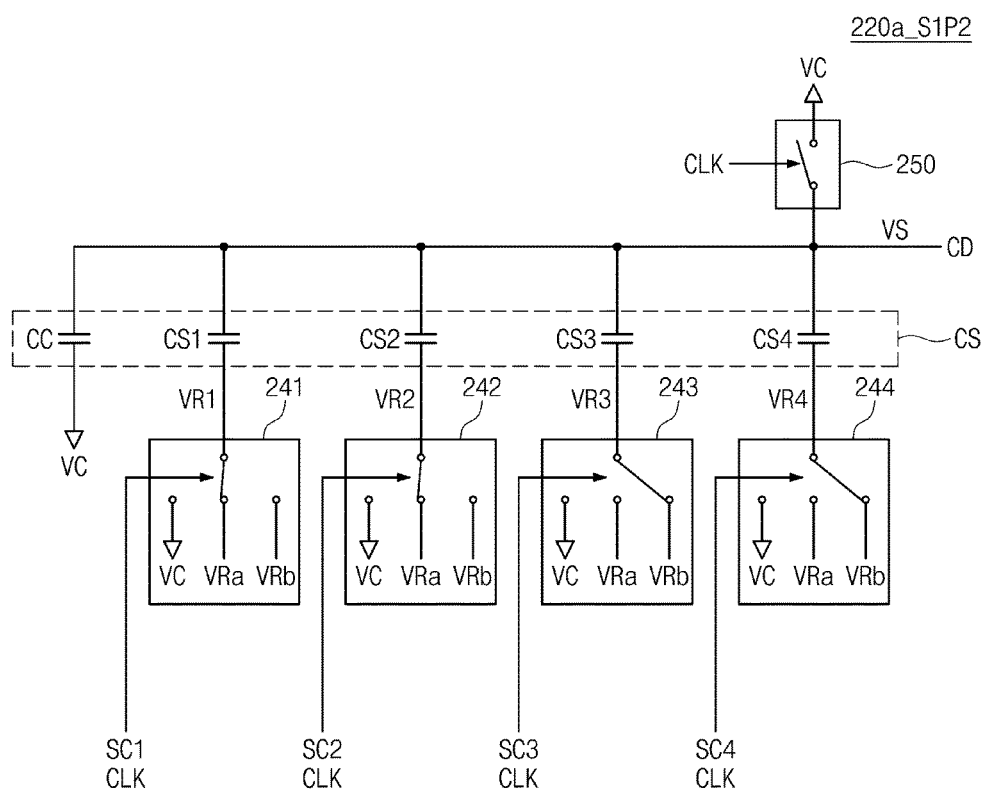
FIG. 11 illustrates an example in which a scaler operates in a first sequence.

FIG. 10 illustrates an example in which an input calculator 210_P2 operates in the second phase P2. FIG. 11 illustrates an example in which a scaler 220a_S1P2 operates in the second phase P2 of the first sequence SEQ1. Referring to FIGS. 10 and 11, the clock signal CLK may have a second level (e.g., a low level) in the second phase P2.

In response to the clock signal CLK, that is, when the clock signal CLK is at the low level, first to fourth addition switches 231 to 234 may respectively transfer the first to fourth input voltages VIN1 to VIN4 to the first to fourth addition capacitors CA1 to CA4. First switch 239 stops transferring the common voltage VC to the first end of the quantizer capacitor CD.

Accordingly, in the second phase P2, input calculator 210_P2 may transfer the first to fourth input voltages VIN1 to VIN4 to the first end of the quantizer capacitor CD after applying gains corresponding to the first to fourth addition capacitors CA1 to CA4 to the first to fourth input voltages VIN1 to VIN4. The first to fourth addition capacitors CA1 to CA4 are connected to the first end of the quantizer capacitor CD in parallel. Accordingly, the first to fourth input voltages VIN1 to VIN4 may be added at the first end of the quantizer capacitor CD, with the capacitances of the first to fourth addition capacitors CA1 to CA4 applied to the first to fourth input voltages VIN1 to VIN4.

In response to the clock signal CLK, that is, when the clock signal CLK is at the low level, first to fourth scale switches 241 to 244 may respectively transfer first to fourth reference voltages VR1 to VR4 to the first to fourth scale capacitors CS1 to CS4. Each of the first to fourth reference voltages VR1 to VR4 may be selected from the lower reference voltage VRa and the upper reference voltage VRb.

For example, each of first to fourth scale switches 241 to 244 may transfer one of the lower reference voltage VRa and the upper reference voltage VRb to the corresponding scale capacitor of the first to fourth scale capacitors CS1 to CS4, depending on the corresponding code of codes SC1 to SC4.

For example, when the codes SC1 to SC4 are initialized, half the codes SC1 to SC4 may select the lower reference voltage VRa, and the others thereof may select the upper reference voltage VRb. In an embodiment, first and second scale switches 241 and 242 may transfer the lower reference voltage VRa to the first and second scale capacitors CS1 and CS2. Third and fourth scale switches 243 and 244 may transfer the upper reference voltage VRb to the third and fourth scale capacitors CS3 and CS4.

The common capacitor CC may support a voltage of the second end of the quantizer capacitor CD to the common voltage VC or greater. The first to fourth scale capacitors CS1 to CS4 are connected to the second end of the quantizer capacitor CD in parallel. The first to fourth scale capacitors CS1 to CS4 have the same capacitance. Accordingly, at the second end of the quantizer capacitor CD, the lower and upper reference voltages VRa and VRb may be applied according to a selected ratio.

Figure 12:
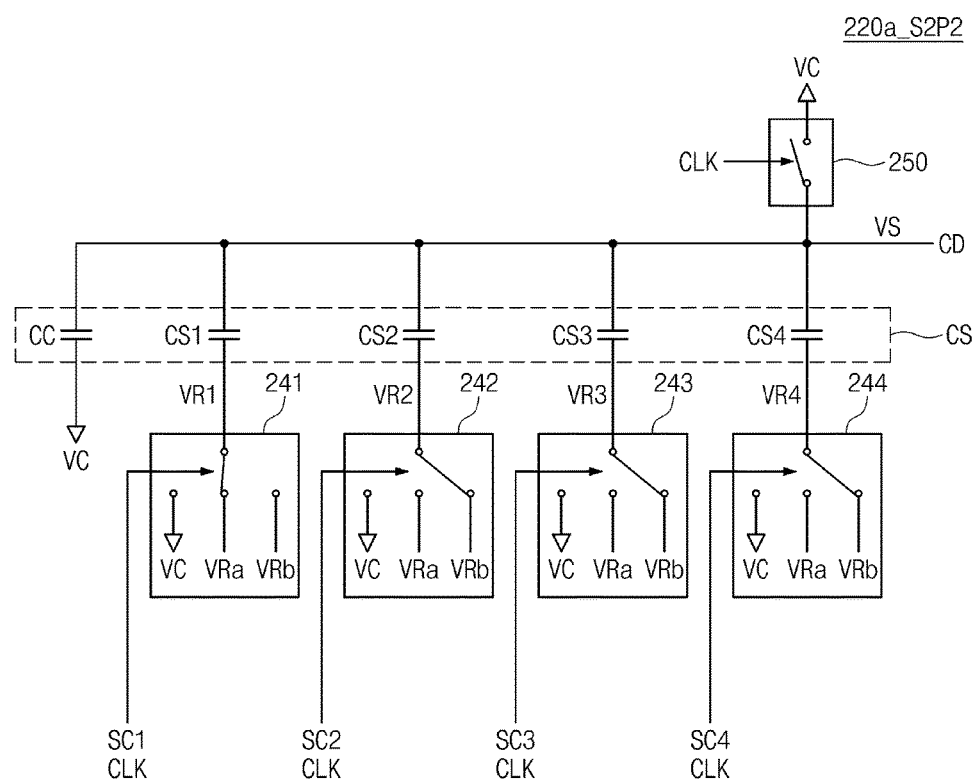
FIG. 12 illustrates an example in which a scaler operates in a second phase of a second sequence.

FIG. 12 illustrates an example in which a scaler 220a_S2P2 operates in the second phase of the second sequence SEQ2. Referring to FIG. 12, as described with reference to the second sequence SEQ2 of FIG. 7, code generator 220d may adjust the scale voltage VS to a level of the third comparison voltage VC3 between the upper reference voltage VRb and the second comparison voltage VC2.

For example, depending on the codes SC1 to SC4, first to fourth scale switches 241 to 244 may select the lower reference voltage VRa and the upper reference voltage VRb at a ratio of 1:3. For example, first scale switch 241 may transfer the lower reference voltage VRa to the first scale capacitor CS1. Second to fourth scale switches 242 to 244 may transfer the upper reference voltage VRb to the second to fourth scale capacitors CS2 to CS4.

As described with reference to FIGS. 8 to 12, if input calculator 210 and scaler 220*a* operates, the output voltage VOUT may be calculated according to Equation 1.

$$VOUT = \frac{CD + CS}{CD \cdot CS + CD \cdot CA + CS \cdot CA} \cdot \left( \sum_{i=1}^{m} CAi \cdot VINi - \frac{CD}{CD + CS} \cdot \sum_{j=1}^{n} CSj \cdot VRj \right)$$ [Equation 1]

In Equation 1: "CD" denotes a capacitance of the quantizer capacitor CD. "CAi" denotes a capacitance of an i-th addition capacitor (i being a positive integer), "CSj" denotes a capacitance of a j-th scale capacitor (j being a positive integer), "VRj" denotes a j-th reference voltage that the j-th scale switch supplies to the j-th scale capacitor, "m" denotes the number of input voltages, and "n" denotes the number of scale capacitors (or switches).

Equation 1 has the form of subtracting a sum of the first to fourth reference voltages VR1 to VR4 from a sum of the first to fourth input voltages VIN1 to VIN4. The first to fourth input voltages VIN1 to VIN4 may be added by using the capacitances of the first to fourth addition capacitors CA1 to CA4 as coefficients. That is, the first to fourth addition capacitors CA1 to CA4 may correspond to the unit gain and the first to third gains A1 to A3 of first to third gain adjustment units 211 to 213.

As described with reference to FIGS. 3 to 5, capacitors of input calculator 210 and scaler 220*a* may be implemented based on the same capacitance (e.g., a unit capacitor). Assuming that a capacitance of the unit capacitor is "CU", all capacitances of Equation 1 may be expressed by a multiple of "CU".

Accordingly, all coefficients of Equation 1 may be expressed by an integer (or a real number). If input calculator 210 and scaler 220*a* are implemented based on the same unit capacitor, quantizer 200 and delta-sigma modulator 100 may be robust to external noise and have a high reliability.

Figure 13:
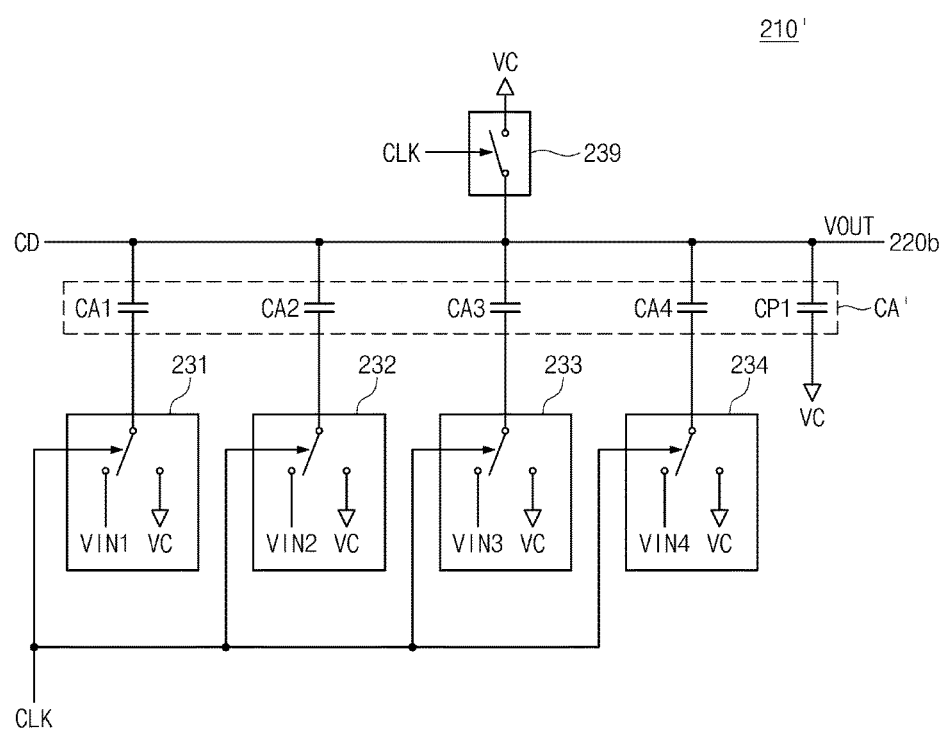
FIG. 13 illustrates an example of an input calculator including a first parasitic capacitor modeled.

FIG. 13 illustrates an example of an input calculator 210' including a first parasitic capacitor CP1 modeled. Referring to FIG. 13, the first parasitic capacitor CP1 may be modeled at the first end of the quantizer capacitor CD. The first parasitic capacitor CP1 may be modeled as being connected between a node, to which the common voltage VC is supplied, and the first end of the quantizer capacitor CD.

Referring to FIG. 13, an addition capacitance CA' may change due to the first parasitic capacitor CP1. For example, the addition capacitance CA' may increase due to the first parasitic capacitor CP1. However, as expressed in Equation 1, the addition capacitance CA' is applied only to a coefficient outside parentheses. Accordingly, a voltage level of the output voltage VOUT may vary proportionally, but a logical level of the output voltage VOUT may not vary. Accordingly, an abnormal operation may not occur in input calculator 210' and quantizer 200 due to the modeled first parasitic capacitor CP1.

Figure 14:
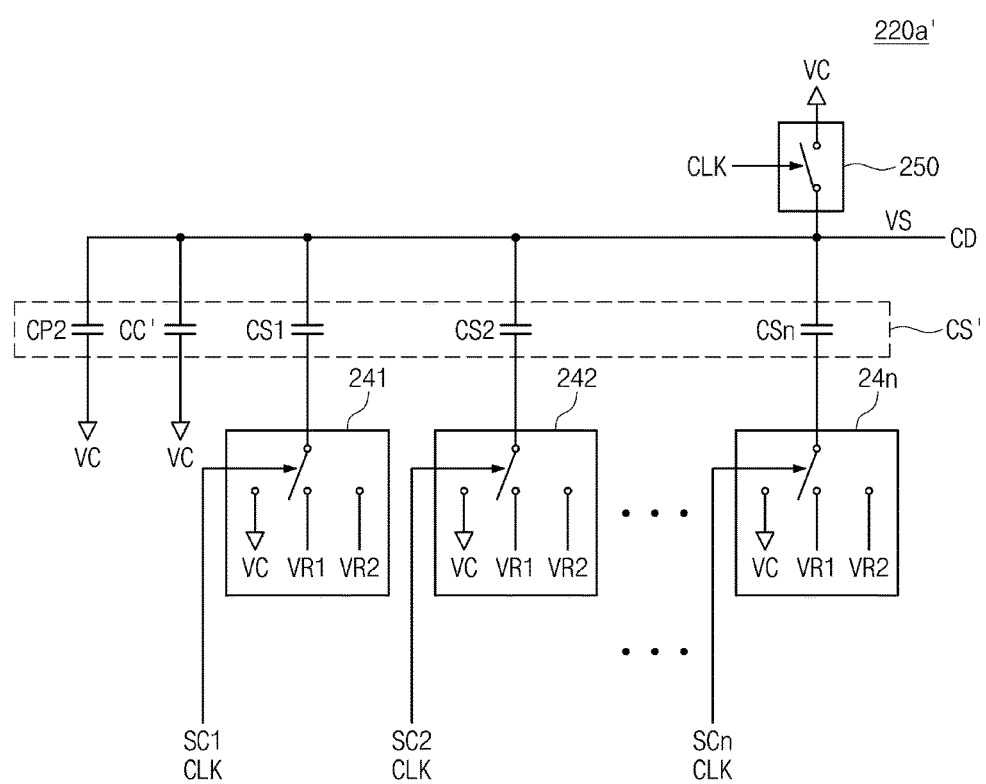
FIG. 14 illustrates an example of a scaler including a second parasitic capacitor modeled.

FIG. 14 illustrates an example of a scaler 220*a'* including a second parasitic capacitor CP2 modeled. Referring to FIG. 14, the second parasitic capacitor CP2 may be modeled at the second end of the quantizer capacitor CD. The second parasitic capacitor CP2 may be modeled as being connected between a node, to which the common voltage VC is supplied, and the second end of the quantizer capacitor CD.

A capacitance of a common capacitor CC' may be adjusted in consideration of the second parasitic capacitor CP2. For example, the capacitance of the common capacitor CC' may decrease due to the second parasitic capacitor CP2. If the common capacitor CC' is adjusted to reflect the second parasitic capacitor CP2, a scale capacitance CS' may be maintained without change. Accordingly, influence of the second parasitic capacitor CP2 may be compensated.

In an embodiment, the common capacitor CC' may have the structure described with reference to FIG. 4. Like other capacitors, the common capacitor CC' may be implemented based on a unit capacitor.

Figure 15:
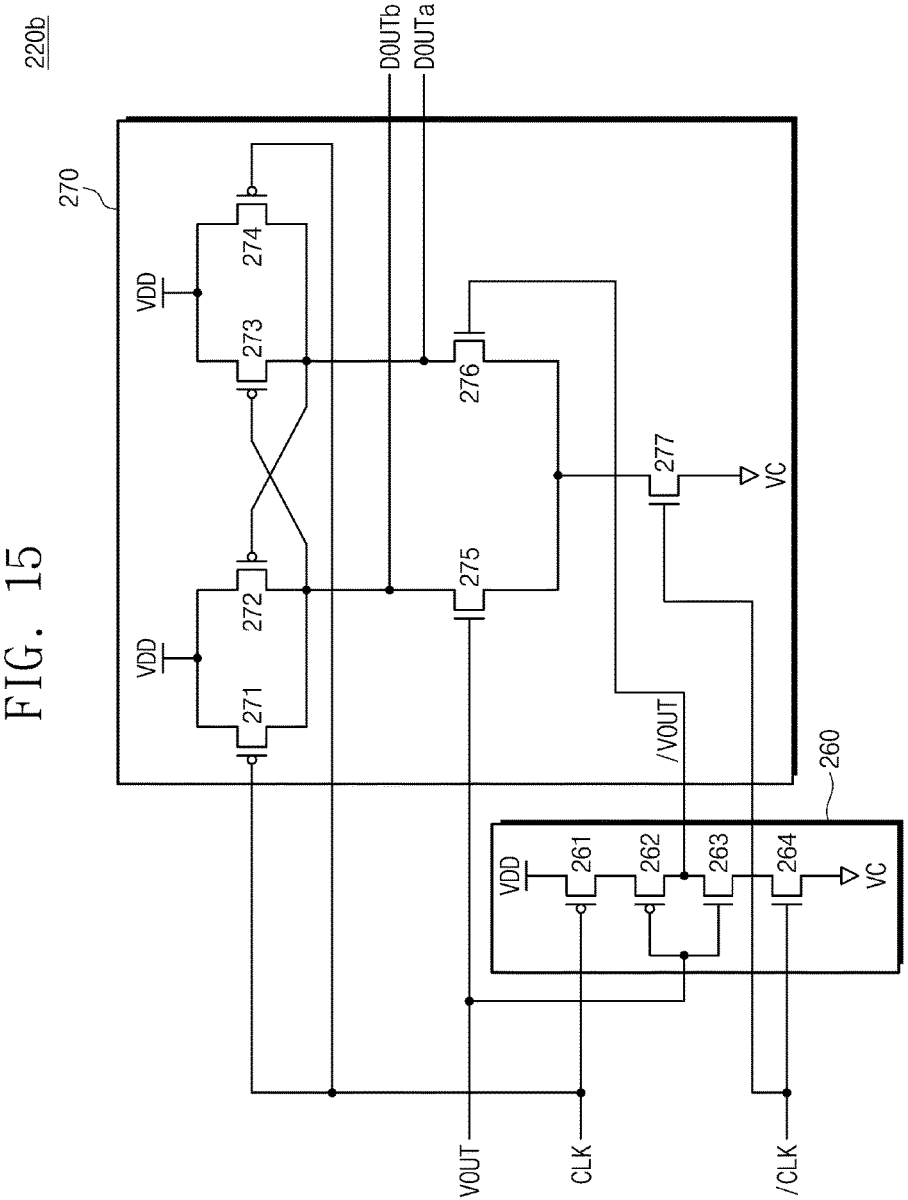
FIG. 15 is a circuit diagram illustrating an example of a latch.

FIG. 15 is a circuit diagram illustrating an example of latch 220*b*. Referring to FIGS. 2 and 15, latch 220*b* includes an inverter 260 and a main latch 270. Inverter 260 includes first to fourth inverter transistors 261 to 264. First to fourth inverter transistors 261 to 264 are connected in series between a node to which a power supply voltage VDD is supplied and a node to which the common voltage VC is supplied.

First and second inverter transistors 261 and 262 may include PMOS transistors. Third and fourth inverter transistors 263 and 264 may include NMOS transistors. The output voltage VOUT may be transferred to gates of second and third inverter transistors 262 and 263.

The clock signal CLK may be transferred to a gate of first inverter transistor 261. An inverted clock signal/CLK may be transferred to a gate of fourth inverter transistor 264. For example, the inverted clock signal/CLK may be generated from the clock signal CLK. For example, the inverted clock signal/CLK may be generated from the clock signal CLK by using an inverter (e.g., another inverter 260).

When the clock signal CLK has the high level, or when the inverted clock signal/CLK has the low level, that is, in the first phase P1, first and fourth inverter transistors 261 and 264 are turned off. That is, inverter 260 may be in an inactive state. When the clock signal CLK has the low level, or when the inverted clock signal/CLK has the high level, that is, in the second phase P2, first and fourth inverter transistors 261 and 264 are turned on.

When the output voltage VOUT is at logic high, third inverter transistor 263 may output logic low as an inverted output voltage/VOUT. When the output voltage VOUT is at logic low, second inverter transistor 262 may output logic high as the inverted output voltage/VOUT.

Main latch 270 includes first to seventh main latch transistors 271 to 277. First ends of first to fourth main latch transistors 271 to 274 may be connected to the node to which the power supply voltage VDD is supplied. Second ends of first and second main latch transistors 271 and 272 may be connected to each other. Second ends of third and fourth main latch transistors 273 and 274 may be connected to each other.

A first end of fifth main latch transistor 275 may be connected to the second ends of first and second main latch transistors 271 and 272. A second end of fifth main latch transistor 275 may be connected to a first end of seventh main latch transistor 277. A first end of sixth main latch transistor 276 may be connected to the second ends of third and fourth main latch transistors 273 and 274. A second end of sixth main latch transistor 276 may be connected to the first end of seventh main latch transistor 277.

A second end of seventh main latch transistor 277 may be connected to the node to which the common voltage VC is supplied. The inverted clock signal /CLK may be supplied to a gate of seventh main latch transistor 277. The clock signal CLK may be supplied to gates of first and fourth main latch transistors 271 and 274.

When the clock signal CLK is at the low level, first, fourth, and seventh main latch transistors 271, 274, and 277 may be turned on. That is, main latch 270 may be activated. When the clock signal CLK is at the high level, first, fourth, and seventh main latch transistors 271, 274, and 277 may be turned off. That is, main latch 270 may be deactivated.

A gate of second main latch transistor 272 may be connected to the second ends of third and fourth main latch transistors 273 and 274. A gate of third main latch transistor 273 may be connected to the second ends of first and second main latch transistors 271 and 272. The output voltage VOUT is supplied to the gate of fifth main latch transistor 275. The inverted output voltage /VOUT is supplied to the gate of sixth main latch transistor 276.

The second ends of third and fourth main latch transistors 273 and 274 may be the first intermediate digital output DOUTa. The second ends of first and second main latch transistors 271 and 272 may be the second intermediate digital output DOUTb.

In the second phase P2 where the clock signal CLK is at the low level, when the output voltage VOUT is at the high level, fifth main latch transistor 275 is turned on. Accordingly, the second intermediate digital output DOUTb may transition to the low level. If the second intermediate digital output DOUTb transitions to the low level, third main latch transistor 273 is turned on. Accordingly, the first intermediate digital output DOUTa may transition to the high level.

In the second phase P2 where the clock signal CLK is at the low level, when the output voltage VOUT is at the low level, sixth main latch transistor 276 is turned on. Accordingly, the first intermediate digital output DOUTa may transition to the low level. If the first intermediate digital output DOUTa transitions to the low level, second main latch transistor 272 is turned on. Accordingly, the second intermediate digital output DOUTb may transition to the high level.

Figure 16:
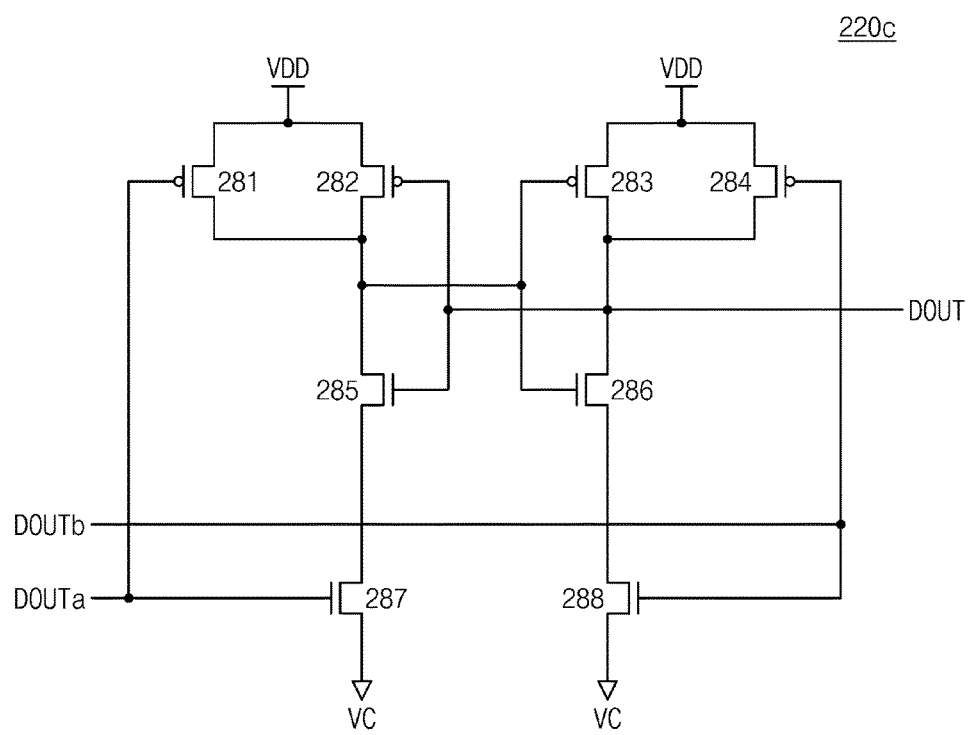
FIG. 16 is a circuit diagram illustrating an embodiment of a set and reset latch.

FIG. 16 is a circuit diagram illustrating an embodiment of a set and reset latch 220c according to an embodiment of the inventive concept. Referring to FIGS. 2 and 16, set and reset latch 220c include first to eighth transistors 281 to 288. First ends of first to fourth transistors 281 to 284 may be connected to the node to which the power supply voltage VDD is supplied.

Second ends of first and second transistors 281 and 282 may be connected to each other. Second ends of third and fourth transistors 283 and 284 may be connected to each other. A first end of fifth transistor 285 may be connected to the second ends of first and second transistors 281 and 282. A second end of fifth transistor 285 may be connected to a first end of seventh transistor 287.

A first end of sixth transistor 286 may be connected to the second ends of third and fourth transistors 283 and 284. The digital output DOUT may be connected to the first end of seventh transistor 286. Second ends of seventh and eighth transistors 287 and 288 may be connected to the node to which the common voltage VC is supplied.

A gate of second transistor 282 may be connected to a gate of fifth transistor 285 and to a node between third and sixth transistors 283 and 286. A level of the gate of second transistor 282 may correspond to the digital output DOUT.

A gate of sixth transistor 286 may be connected to a gate of third transistor 283 and to a node between second and fifth transistors 282 and 285.

The first intermediate digital output DOUTa may be transferred to gates of first and seventh transistors 281 and 287. The second intermediate digital output DOUTb may be transferred to gates of fourth and eighth transistors 284 and 288. First and second intermediate digital outputs DOUTa and DOUTb may be complementary signals.

If the first intermediate digital output DOUTa is at the high level, fourth and seventh transistors 284 and 287. The power supply voltage VDD is transferred to the gate of fifth transistor 285 through fourth transistor 284. Accordingly, the digital output DOUT may transition to the high level.

If the first intermediate digital output DOUTa is at the low level, first transistor 281 is turned on. The power supply voltage VDD is transferred to the gate of sixth transistor 286 through first transistor 281. The second intermediate digital output DOUTb may turn on eighth transistor 288. The common voltage VC is transferred to the gate of fifth transistor 285 through eighth and sixth transistors 288 and 286. Accordingly, the digital output DOUT may transition to the low level.

As described above, set and reset latch 220c may maintain the first and second intermediate digital outputs DOUTa and DOUTb and the digital output DOUT regardless of the clock signal CLK. Accordingly, even when latch 220b is deactivated by a clock signal, set and reset latch 220c may normally output the digital output DOUT.

As described with reference to FIGS. 15 and 16, latch 220b and set and reset latch 220c do not consume a static current. The static current may mean a current that flows even when a latch does not operate. A typical quantizer is implemented by using a comparator or an operational amplifier (or a differential amplifier) consuming the static current.

In contrast, latch 220b and set and reset latch 220c according to the disclosed embodiments do not consume the static current. Accordingly, quantizer 200 where power consumption is reduced and delta-sigma modulator 100 including quantizer 200 are provided.

Also, compared with a comparator, an operational amplifier, or a differential amplifier, latch 220b and set and reset latch 220c described with reference to FIGS. 15 and 16 may have reduced complexity and occupy reduced area. Accordingly, quantizer 200 which is less complex and occupying a reduced area and delta-sigma modulator 100 including quantizer 200 are provided.

According to embodiments disclosed above, a quantizer is implemented by using capacitors. Accordingly, a quantizer having reduced area, reduced complexity, and a reduced static current, and an operating method of the quantizer, are provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:
1. A quantizer, comprising:
a quantizer capacitor having a first end and a second end;
an input calculator configured to receive input voltages, to sum the input voltages, and to output a summed result to the first end of the quantizer capacitor;
a scaler configured to receive reference voltages and a scale code, to generate a scale voltage from the refer- ence voltages depending on the scale code, and to output the scale voltage to the second end of the quantizer capacitor; and a latch configured to store an output voltage of the first end of the quantizer capacitor.

2. The quantizer of claim 1, wherein the scaler is configured to:
further receive a clock signal and a common voltage;
equalize an internal voltage and a voltage of the second end of the quantizer capacitor to the common voltage in a first phase where the clock signal has a first level; and
generate the scale voltage and output the scale voltage to the second end of the quantizer capacitor, in a second phase where the clock signal has a second level.

3. The quantizer of claim 2, wherein the scaler includes:
scale capacitors connected with the second end of the quantizer capacitor;
scale switches connected to the scale capacitors, respectively; and
a switch connected to the second end of the quantizer capacitor,
wherein, in the first phase, the scale switches respectively transfer the common voltage to the scale capacitors depending on the scale code, and the switch transfers the common voltage to the second end of the quantizer capacitor depending on the clock signal.

4. The quantizer of claim 3, wherein the reference voltages include a lower reference voltage and an upper reference voltage, and
wherein, in the second phase, depending on a corresponding portion of the scale code, each of the scale switches transfers one of the lower reference voltage and the upper reference voltage to a corresponding scale capacitor of the scale capacitors.

5. The quantizer of claim 3, wherein the scaler further includes:
a common capacitor connected between the second end of the quantizer capacitor and a node to which the common voltage is supplied.

6. The quantizer of claim 5, wherein a capacitance of the common capacitor is determined according to a parasitic capacitance of the scaler.

7. The quantizer of claim 3, wherein, in the second phase, the switch stops transferring the common voltage to the second end of the quantizer capacitor depending on the clock signal.

8. The quantizer of claim 1, wherein the input calculator is configured to:
further receive a clock signal and a common voltage;
equalize an internal voltage and a voltage of the first end of the quantizer capacitor to the common voltage in a first phase where the clock signal has a first level; and
output the input voltages to the first end of the quantizer capacitor after respectively applying gains to the input voltages, in a second phase where the clock signal has a second level.

9. The quantizer of claim 8, wherein the input calculator includes:
addition capacitors connected with the first end of the quantizer capacitor;
addition switches connected to the addition capacitors, respectively; and
a switch connected to the first end of the quantizer capacitor,
wherein, in the first phase, the addition switches respectively transfer the common voltage to the addition capacitors depending on the clock signal, and the switch transfers the common voltage to the first end of the quantizer capacitor depending on the clock signal.

10. The quantizer of claim 9, wherein the addition switches transfer the input voltages to the addition capacitors depending on the clock signal in the second phase.

11. The quantizer of claim 10, wherein capacitances of the addition capacitors are determined according to the gains applied to the input voltages.

12. The quantizer of claim 8, wherein the latch further receives the clock signal,
wherein, in the second phase where the clock signal has the second level, the latch stores a first logical level of a voltage of the first end of the quantizer capacitor and stores a second logical level corresponding to an inverted version of the first logical level.

13. The quantizer of claim 12, further comprising:
a second latch configured to store the first logical level and the second logical level output from the latch and to output the first logical level as a quantized value.

14. The quantizer of claim 13, further comprising:
a code generator configured to receive the quantized value from the second latch and to adjust the scale code depending on the quantized value.

15. A quantizer, comprising:
a quantizer capacitor having a first end and a second end;
an input calculator including addition capacitors and configured to receive input voltages, to combine the input voltages by using the addition capacitors, and to transfer a combined result to the first end of the quantizer capacitor;
a scaler including scale capacitors and configured to receive reference voltages, to generate a scale voltage by combining the reference voltages by using the scale capacitors, and to transfer the scale voltage to the second end of the quantizer capacitor; and
a latch configured to store a logical level of an output voltage of the first end of the quantizer capacitor.

16. The quantizer of claim 15, wherein the input calculator is configured to receive an input voltage of a delta-sigma modulator and output voltages of integrators of the delta-sigma modulator as the input voltages.

17. The quantizer of claim 15, further comprising:
a code generator configured to generate a scale code for controlling a ratio, by which the scale capacitors combine the reference voltages, depending on the logical level output from the latch, such that quantization is performed based on successive approximation.

18. The quantizer of claim 17, wherein a number of the scale capacitors is determined according to a number of bits that are quantized based on the successive approximation.

19. An operation method of a quantizer which includes a quantizer capacitor, scale capacitors, and addition capacitors, the method comprising:
initializing a scale code;
equalizing voltages of the scale capacitors and the addition capacitors;
combining input voltages by using the addition capacitors, and applying a result of combining the input voltages to a first end of the quantizer capacitor;
combining reference voltages by using the scale capacitors depending on the scale code, and applying a result of combining the reference voltages to a second end of the quantizer capacitor; and
latching a voltage of the first end of the quantizer capacitor.

20. The method of claim 19, further comprising:
adjusting the scale code depending on the latched voltage, wherein the equalizing, combining the input voltages to apply the combined result of the input voltages to the first end, and combining the reference voltages to apply the combined result of the reference voltages to the second end are repeated X times, wherein X is selected based on the adjusted scale code.

* * * * *